(12) United States Patent  (10) Patent No.: US 7,800,183 B2
Okuno et al.  (45) Date of Patent: Sep. 21, 2010

(54) SEMICONDUCTOR DEVICE

(75) Inventors: Takahiro Okuno, Tokyo (JP); Shigeru Kusunoki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/464,368

(22) Filed: May 12, 2009

(65) Prior Publication Data

US 2010/0193836 A1    Aug. 5, 2010

(30) Foreign Application Priority Data

Feb. 2, 2009    (JP)    ............................. 2009-021739

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ................ 257/370; 257/372; 257/E21.382; 257/E21.383; 257/E21.384; 257/E21.385; 257/E27.063; 257/E29.197; 257/E29.198; 257/E29.199; 257/E29.2; 257/E29.201

(58) Field of Classification Search .................. 257/370, 257/372, E21.382, E21.383, E21.384, E21.385, 257/E27.063, E29.197, E29.198, E29.199, 257/E29.2, E29.201

See application file for complete search history.

(56) References Cited

U.S. PATENT DOCUMENTS

| | | | | |
|---|---|---|---|---|
| 5,282,018 | A * | 1/1994 | Hiraki et al. | 257/296 |
| 5,597,765 | A * | 1/1997 | Yilmaz et al. | 438/270 |
| 6,501,129 | B2 * | 12/2002 | Osawa | 257/330 |
| 7,659,574 | B2 * | 2/2010 | Kubo et al. | 257/330 |
| 2002/0179950 | A1 * | 12/2002 | Hijzen et al. | 257/301 |
| 2002/0179976 | A1 * | 12/2002 | Takahashi | 257/370 |
| 2005/0280029 | A1 * | 12/2005 | Nakamura et al. | 257/192 |
| 2007/0210350 | A1 * | 9/2007 | Omura et al. | 257/287 |
| 2008/0042172 | A1 * | 2/2008 | Hirler et al. | 257/288 |
| 2008/0197407 | A1 * | 8/2008 | Challa et al. | 257/330 |
| 2009/0140327 | A1 * | 6/2009 | Hirao et al. | 257/328 |
| 2009/0283797 | A1 * | 11/2009 | Takahashi et al. | 257/139 |
| 2010/0059815 | A1 * | 3/2010 | Grivna et al. | 257/330 |

FOREIGN PATENT DOCUMENTS

JP    8-330589    12/1996

(Continued)

*Primary Examiner*—Ida M Soward
(74) *Attorney, Agent, or Firm*—Oblon, Spivak, McClelland, Maier & Neustadt, L.L.P.

(57) ABSTRACT

A semiconductor device includes a substrate of a first conductivity type, a base region of a second conductivity type, a source region of the first conductivity type, a collector region of the second conductivity type, a trench gate, which is formed in a trench via a gate insulation film, an electrically conductive layer, which is formed within a contact trench that is formed through the source region, a source electrode, which is in contact with the electrically conductive layer and the source region, and a latch-up suppression region of the second conductivity type, which is formed within the base region, in contact with the electrically conductive layer, and higher in impurity concentration than the base region. The distance between the gate insulation film and the latch-up suppression region is not less than the maximum width of a depletion layer that is formed in the base layer by the trench gate.

5 Claims, 9 Drawing Sheets

FOREIGN PATENT DOCUMENTS

| | | |
|---|---|---|
| JP | 2001-168333 | 6/2001 |
| JP | 2001-308328 | 11/2001 |
| JP | 2003-101019 | 4/2003 |
| JP | 2004-95962 | 3/2004 |
| JP | 2004-303964 | 10/2004 |

* cited by examiner

SEMICONDUCTOR DEVICE

BACKGROUND OF THE INVENTION

1. Field of the Invention

The present invention relates to a semiconductor device that suppresses latch-up by decreasing the resistance of a base region.

2. Background Art

Semiconductor devices called "power devices," such as IGBTs (Insulated Gate Bipolar Transistors), have been improved to handle high voltages and large currents and widely used with power control apparatuses for use, for instance, in bullet trains and in the fields of transportation and industrial equipment.

The above semiconductor devices control a large current by performing switching operations such as turn-on and turn-off. It is desired that a switching operation be performed in a region called a safe operating area (SOA). The SOA is defined as a safety operating area where a semiconductor device turns on and turns off. More specifically, the SOA defines a range within which the operating locus of a collector current (Ic) and collector-emitter voltage (Vce) is confined. The SOA is defined in accordance with Ic rating and Vce rating. The SOA for defining the Ic-Vce operating locus prevailing at turn-off is particularly called a reverse bias SOA (RBSOA). For example, a snubber circuit of an actual IGBT or other semiconductor device is designed so as not to exceed the above SOA.

From the viewpoint of safe semiconductor device operations, it is essential that semiconductor device switching take place within the RBSOA or other SOA. However, holes may be accumulated in a p-type base layer so that the base layer charges up. It is conceivable that a thyristor parasitically formed in a semiconductor device may turn on, as a result of such charge-up, to cause a latch-up phenomenon. When such a phenomenon occurs, the SOA may be exceeded to damage the semiconductor device.

As a method of suppressing the above-mentioned latch-up phenomenon, a scheme for suppressing the ON operation of a parasitic thyristor by forming a p-type high-concentration region in a body region is disclosed, for instance, in JP-A-2001-308328.

The aforementioned method of suppressing a latch-up phenomenon, which is disclosed in JP-A-2001-308328, forms a new P+ layer in a base region. The addition of such a P+ layer affects the threshold voltage and various other characteristics of a semiconductor device. This is true not only of the configuration disclosed in JP-A-2001-308328 but also of a case where the resistance of the base region is to be decreased by increasing, for instance, the impurity concentration of the base layer itself. As seen from the above, it is necessary to form the P+ layer while considering the characteristics that vary with impurity profile changes in the base layer. Therefore, there has been a trade-off between providing latch-up suppression by the sacrifice of optimization of various characteristics of a semiconductor device and optimizing various characteristics of a semiconductor device by the sacrifice of adequate latch-up suppression.

SUMMARY OF THE INVENTION

The present invention has been made to solve the above problem. An object of the present invention is to provide a semiconductor device that is capable of improving the RBSOA by suppressing latch-up without affecting the threshold voltage and other characteristics of the semiconductor device.

According to one aspect of the present invention, a semiconductor device includes a semiconductor substrate of a first conductivity type, a base region of a second conductivity type, which is formed on the front surface of the semiconductor substrate, a source region of the first conductivity type, which is formed on the front surface of the base region, a collector region of the second conductivity type, which is formed on the back surface of the semiconductor substrate, a trench gate, which is formed in a trench via a gate insulation film, the trench being formed through the source region and the base region, an electrically conductive layer, which is formed within a contact trench that is formed through the source region, a source electrode, which is in contact with the electrically conductive layer and the source region, and a latch-up suppression region of the second conductivity type, which is formed within the base region, in contact with the electrically conductive layer, and higher in impurity concentration than the base region. The distance between the gate insulation film and the latch-up suppression region is not less than the maximum width of a depletion layer that is formed in the base layer by the trench gate.

According to another aspect of the present invention, a semiconductor device includes, a semiconductor substrate of a first conductivity type, a base region of a second conductivity type, which is formed on the front surface of the semiconductor substrate, a source region of the first conductivity type, which is formed on the front surface of the base region, a high-concentration impurity region of the second conductivity type, which is formed on the front surface of the base region, in contact with the source region, and higher in impurity concentration than the base region, a collector region of the second conductivity type, which is formed on the back surface of the semiconductor substrate, a trench gate, which is formed in a trench via a gate insulation film, the trench being formed within the base region through the source region, a dummy trench, which is formed in parallel with the trench gate and positioned toward the trench gate rather than toward the high-concentration impurity region, and a source electrode, which is in contact with the high-concentration impurity region and the source region. The dummy trench is provided with a break.

Other and further objects, features and advantages of the invention will appear more fully from the following description.

DETAILED DESCRIPTION OF THE PREFERRED EMBODIMENTS

First Embodiment

A first embodiment of the present invention relates to a semiconductor device that is capable of providing latch-up suppression while reducing the influence upon the characteristics of the semiconductor device. FIGS. 1 to 5 are diagrams illustrating the semiconductor device according to the first embodiment. Elements that are shown in these figures and designated by the same reference numerals may not be redundantly described because they are based on the same concept or made of the same materials. This is also true of the drawings illustrating the other embodiments.

Figure 1:
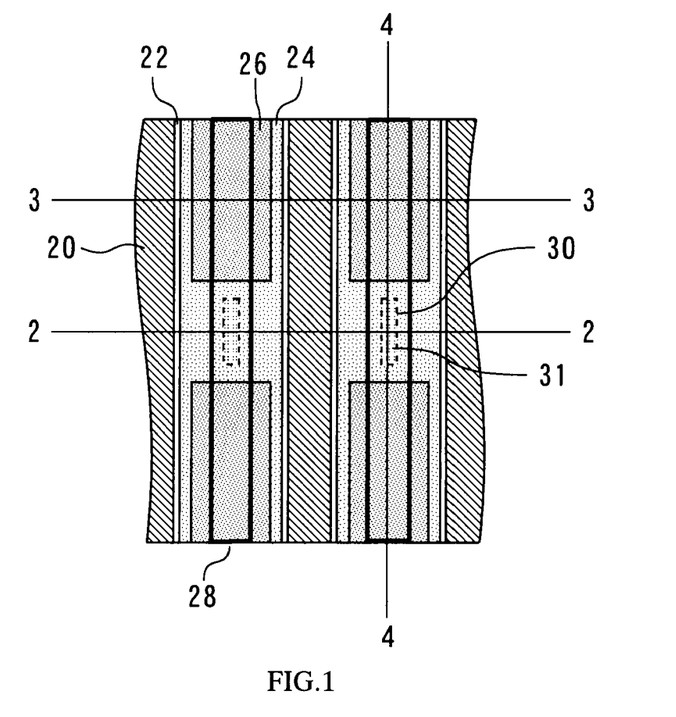
FIG. 1 is a plan view of the semiconductor device according to the first embodiment.

FIG. 1 is a plan view of the semiconductor device according to the present embodiment. A trench gate 20 to which a gate drive signal is transmitted is formed in contact with a gate insulation film 22. A source region 24 is formed in contact with the gate insulation film 22. The source region 24 is a region where an n-type impurity is doped. Further, a P+ region 26 is formed in contact with the source region 24. The P+ region 26 is a high-concentration impurity region where a p-type impurity is doped at high concentration. The high-concentration impurity region is a region where an impurity is doped at a higher concentration than in a later-described base layer. This region is mainly used to specify the potential of the base layer. In the present embodiment, the P+ region 26 serves as the high-concentration impurity region.

In addition, a contact trench 30 is formed in the source region 24. In FIG. 1, the contact trench 30 is indicated by a broken line. The contact trench 30 is buried by an electrically conductive layer 31. The electrically conductive layer 31 is not particularly limited as far as it is made of an electrical conductor. However, it is typically made of P+ polysilicon. The contact trench 30, which has the electrically conductive layer 31 described above, is formed between one trench gate 20 and another. The semiconductor device according to the present embodiment will be described below with reference to FIG. 2.

Figure 2:
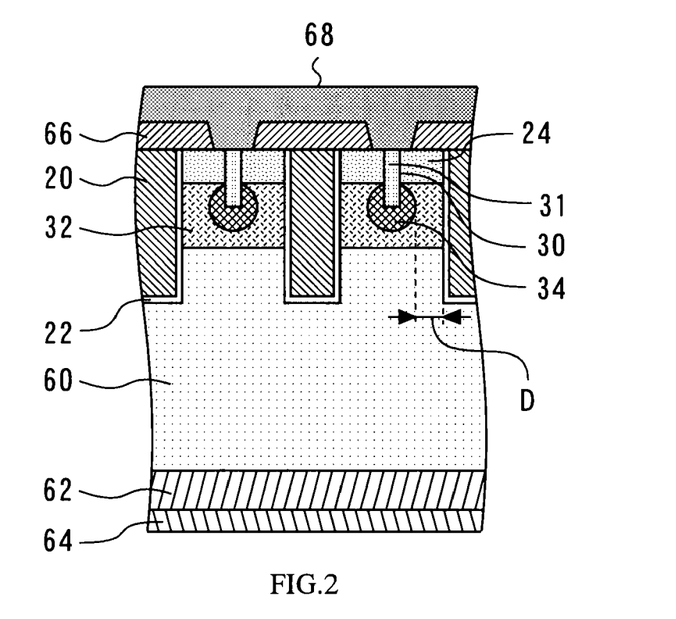
FIG. 2 is a cross-sectional view taken along line 2-2 in FIG. 1.

FIG. 2 illustrates, for example, a cross section of the aforementioned contact trench 30. FIG. 2 is a cross-sectional view taken along line 2-2 in FIG. 1. For the sake of explanation, FIG. 2 shows an insulation film 66 and a source electrode 68, which are not shown in FIG. 1. In FIG. 1, a portion in which the source electrode 68 is in contact, for instance, with the P+ region 26 or source region 24 is enclosed as a contact 28.

The semiconductor device according to the present embodiment includes a semiconductor substrate 60, which is of n-type and a conductivity modulation region, as is the case with a well-known vertical power device. A base region 32 is formed on the front surface of the semiconductor substrate 60. The base region 32 is a p-type semiconductor layer. The base region 32 forms a MOS structure in coordination with the aforementioned trench gate 20 and performs an ON/OFF operation for a well-known vertical power device. Meanwhile, an n-type carrier suppression region 62 is formed on the back surface of the semiconductor substrate 60. In addition, a p-type collector region 64 is formed in contact with the carrier suppression region 62. The configurations and functions of these elements will not be described in detail because they are widely known.

As shown in FIG. 2, the present embodiment is configured so that the contact trench 30 is extended to the base region 32 through the source region 24. In the base region 32, a latch-up suppression region 34 is formed in contact with the electrically conductive layer 31, which is formed within the contact trench 30. The latch-up suppression region 34 is a p-type semiconductor layer. Impurity injection takes place in the latch-up suppression region 34 so that the resulting impurity concentration is higher than in the base region 32. The latch-up suppression region 34 is connected to the source electrode 68 through the electrically conductive layer 31. Thus, the latch-up suppression region 34 can decrease the resistance of the base region 32 as described later.

The latch-up suppression region 34 is formed, for instance, by a method described below. The latch-up suppression region 34 is formed by injecting ions during the time interval between the instant at which the contact trench 30 is formed and the instant at which the contact trench 30 is buried later by the electrically conductive layer 31. For process reduction purposes, the ion injection operation is performed, for instance, by using a resist pattern, which was employed to prepare the contact trench 30, as a mask. In this manner, the latch-up suppression region 34, which is in contact with the electrically conductive layer 31, is formed in the base region 32, which is deeper than the source region 24.

Figure 3:
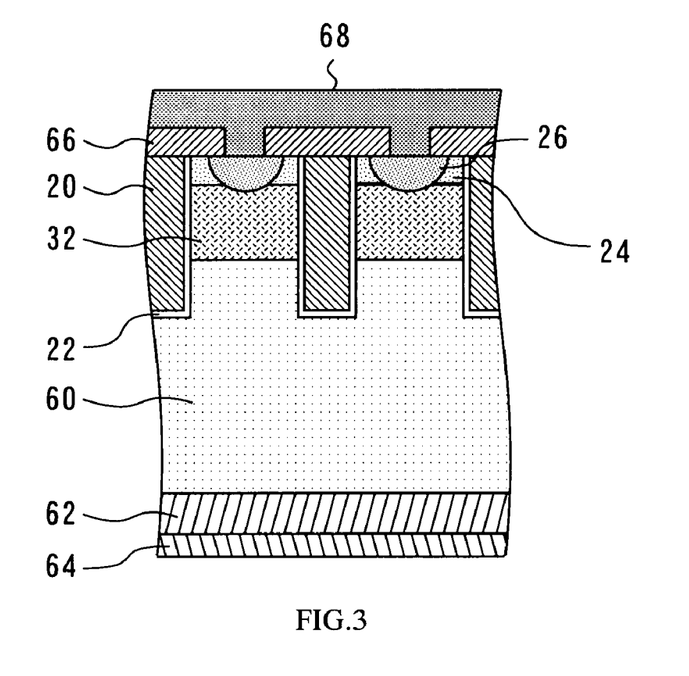
FIG. 3 is a cross-sectional view taken along line 3-3 in FIG. 1.
Figure 5:
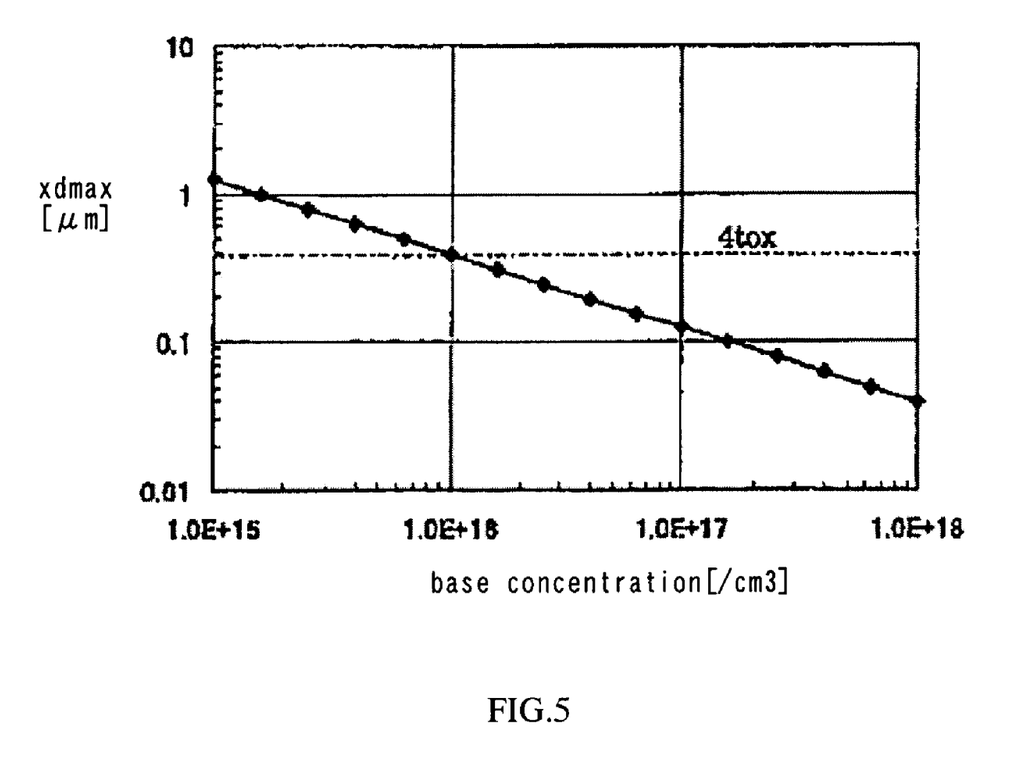
FIG. 5 illustrates the dependence of xdmax on NA.

Oblique ion injection may be conducted as needed to form the latch-up suppression region 34. The present embodiment defines the profile of the latch-up suppression region 34 so that the interval between the latch-up suppression region 34 and the gate insulation film 22 meets the following condition. In other words, the distance D between the latch-up suppression region 34 and the gate insulation film 22 meets Equation (1) below:

$$D \rangle \sqrt{\frac{2\varepsilon s \varepsilon o \cdot 2\Phi_F}{qN_A}} = xd \text{ max} \tag{1}$$

where
  $\varepsilon s$=relative permittivity of base region
  $\varepsilon o$=permittivity of vacuum
  $\Phi_F$=Fermi potential
  q=electrical charge
  $N_A$=carrier density [/cm$^3$] of base region
  xd max=maximum depletion layer width The above equation requires that the distance D between the latch-up suppression region 34 and the gate insulation film 22 be greater than the maximum depletion layer width xdmax. The maximum depletion layer width xdmax is the width of a depletion layer that is formed in the base region 32 when a voltage equivalent to the threshold voltage for the aforementioned MOS structure is applied to the trench gate 20. When a typical value of xdmax in an IGBT or other power device is calculated, it is substantially equal to $3936/\sqrt{N_A}$ (/cm$^3$)×1E4 [μm]. The base concentration of a common power device (the carrier density of the base region) ranges from $1.0E16/cm^3$ to $1.0E18/cm^3$. The thickness of the gate insulation film (Tox) is approximately 0.1 µm. The Fermi potential $\Phi_F$, is approximately 0.6 V. FIG. 5 is a graph that is based on the above values to illustrate the dependence of xdmax on $N_A$. FIG. 5 indicates that the value xdmax is not greater than four times the value Tox when the base concentration is between $1.0E16/cm^3$ and $1.0E18/cm^3$. As described above, the latch-up suppression region 34 is formed at a place that will not be reached by the depletion layer, which is formed in the base region 32 by the trench gate 20. Next, a region where the latch-up suppression region 34 is not formed will be described with reference to FIG. 3.

FIG. 3 is a cross-sectional view taken along line 3-3 in FIG. 1. This cross-sectional view indicates that the P+ region 26 is formed on the base region 32 and brought into contact with the source region 24. The P+ region 26 is connected to an emitter electrode 68 to decrease the resistance between the emitter electrode 68 and the base region 32, thereby determining the potential of the base region 32. Next, FIG. 4, which is a cross-sectional view taken along the longitudinal direction of the trench gate 20, will be used for explanation purposes.

Figure 4:
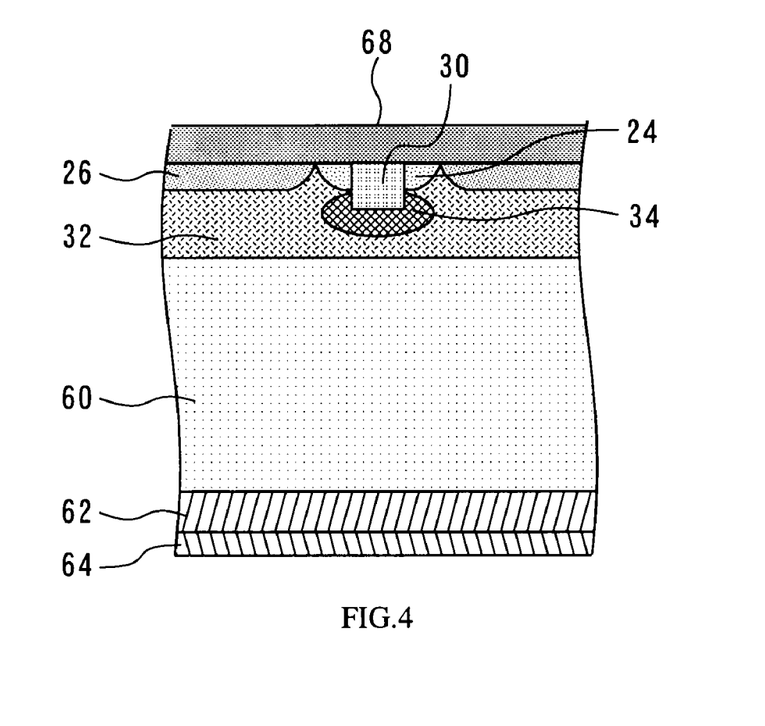
FIG. 4 is a cross-sectional view taken along line 4-4 in FIG. 1.

FIG. 4 is a cross-sectional view taken along line 4-4 in FIG. 1. The width of the latch-up suppression region 34 shown in FIG. 4 represents the longitudinal spread of the trench gate 20 in the latch-up suppression region 34. The limitation expressed by Equation (1) is not imposed on the longitudinal direction of the trench gate 20; therefore, the latch-up suppression region 34 has a relatively great width. Such an increased width of the latch-up suppression region 34 helps to decrease the resistance of the base region 32.

The present embodiment is characterized in that the latch-up suppression region 34 is formed within the base region 32 and in contact with the electrically conductive layer 31, which buries the contact trench 30. Holes in the base region 32 can move out of the base region 32 through the latch-up suppression region 34. This makes it possible to suppress charge-up of the base region 32, which may cause the latch-up of a parasitic thyristor that is composed of the source region 24, base region 32, semiconductor substrate 60, and collector region 64.

Holes in the base region 32, which is positioned directly below the source region 24, tend to stay in the base region 32 because there is no hole path in the vicinity thereof. However, the present embodiment is configured so that the holes in the base region 32 directly below the source region 24 are immediately expelled from the source region 24 through the latch-up suppression region 34. This decreases the resistance of the source region 24, thereby providing improved latch-up tolerance.

Forming the latch-up suppression region 34, which is a new P+ region, in the base region 32 as described above may affect the other characteristics of the semiconductor device. More specifically, it may affect, for instance, the threshold voltage of an MOS structure that is composed of the trench gate 20, gate insulation film 22, and base region 32. However, the present invention is configured so that the latch-up suppression region 34 is apart from the gate insulation film 22 by the distance D, which is defined earlier. Therefore, the depletion layer formed in the base region 32 does not reach the latch-up suppression region 34. Consequently, the other characteristics of the semiconductor device will not be significantly affected even when the latch-up suppression region 34 is formed. When an attempt is made to decrease the resistance of the base region, for instance, by increasing the impurity doping amount of the entire base region, the resistance of the base region cannot be sufficiently decreased due to the consideration of influence upon the other characteristics. However, the use of the configuration according to the present embodiment is advantageous in that it solves the above trade-off problem.

Further, providing latch-up suppression as described in connection with the present invention is also meaningful in that it improves the RBSOA without affecting the characteristics of semiconductor layers.

A threshold voltage Vth, which is applied to a gate (trench gate) when a mobile charge is induced in a channel due to the formation of an inversion layer, is expressed by Equation (2) below:

$$Vth = -Q_B/C_{ox} + VFB + 2\Phi_F \qquad (2)$$

where $Q_B = -qN_A \cdot xd\ max$ $C_{ox}$ = capacity of gate oxide film

VFB = voltage at which no band bending occurs

Symbols that are in the above equation and identical with those in the preceding equation, which gives the distance D, have the same meanings as described earlier. The maximum depletion layer width xdmax is obtained when the surface potential is two times the Fermi potential. It corresponds to inversion layer formation in the base region. $Q_B$ is the amount of charge per unit area of a region into which the depletion layer in the base region is extended. Therefore, Vth is determined by $Q_B$, which is the amount of charge per unit area of the region into which the depletion layer is extended. In other words, the impurity concentration prevailing outside the maximum depletion layer width xdmax does not affect Vth if the base potential is equal to the source potential. Therefore, when the configuration according to the present embodiment is employed, or more specifically, when the latch-up suppression region 34 is apart from the gate insulation film 22 by the value determined by xdmax, the resistance of the base region can be decreased without affecting the value Vth. To obtain the advantages of the present embodiment, it is ideal that the base potential be equal to the source potential. However, even if these two potentials differ from each other, the advantages of the present embodiment can be obtained as far as the influence of the latch-up suppression region on Vth is insignificant.

The latch-up suppression region 34 according to the present embodiment is formed within the base region 32; however, its depth is not particularly limited. For example, even if the contact trench 30 is formed through the source region 24 in such a manner as to reach the interface between the base region 32 and source region 24, the advantages of the present invention are retained because the latch-up suppression region 34 can be formed within the base region 32. Thus, the contact trench 30 may have any depth as far as the advantages of the present invention are obtained.

However, forming the latch-up suppression region 34 at a level deeper than the P+ region 26 will effectively decrease the resistance of the base region 32. In such an instance, the contact trench 30 can be formed to a desired depth. When the contact trench 30 is formed to reach the base region 32, the ion injection energy for forming the latch-up suppression region 34 can be lower than when the contact trench 30 is formed to reach the interface between the base region 32 and source region 24. When the latch-up suppression region 34 is formed with the ion injection energy decreased, the controllability of the spread of the latch-up suppression region 34 is enhanced so that the latch-up suppression region 34 can be steadily formed with the aforementioned "distance D" maintained.

Although the present embodiment assumes that an electrically conductive type is used, the present invention is not particularly limited to the use of the electrically conductive type combination described above. Further, various other modifications can be made without departure from the scope of the present invention.

Second Embodiment

A second embodiment of the present invention relates to a semiconductor device that decreases the resistance of a base region by forming a break in a dummy trench. The second embodiment will now be described with reference to FIGS. 6 to 17.

Figure 6:
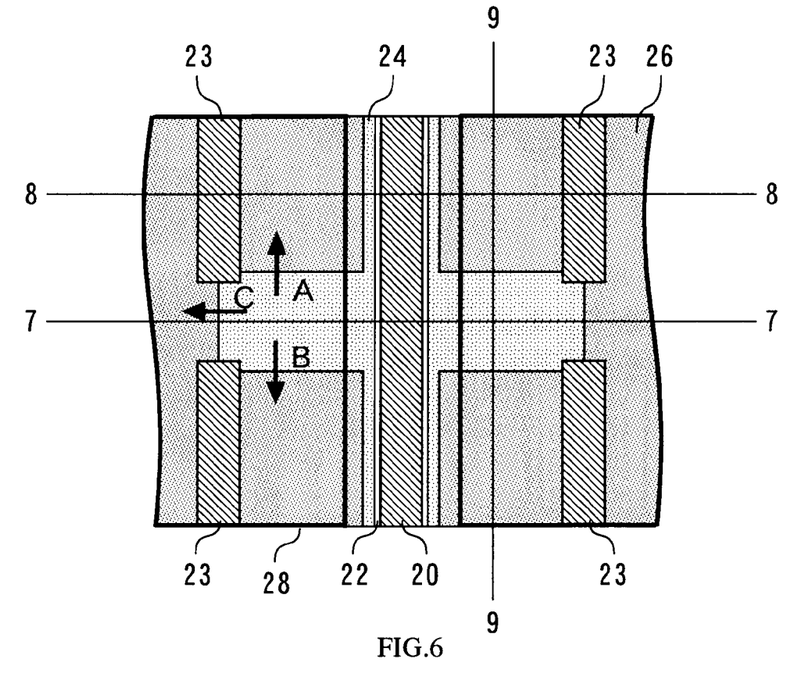
FIG. 6 is a plan view of the semiconductor device according to the second embodiment.

FIG. 6 is a plan view of the semiconductor device according to the present embodiment. FIG. 6 indicates that a dummy trench 23 is formed linearly and discontinuously with a break. The dummy trench 23 is usually formed in parallel with the trench gate 20. The source region 24 is formed along the gate insulation film 22. The source region 24 has a short portion and a long portion, which are formed in the direction from the gate insulation film 22 to the dummy trench 23. The long portion is formed to reach the break in the dummy trench 23.

Figure 7:
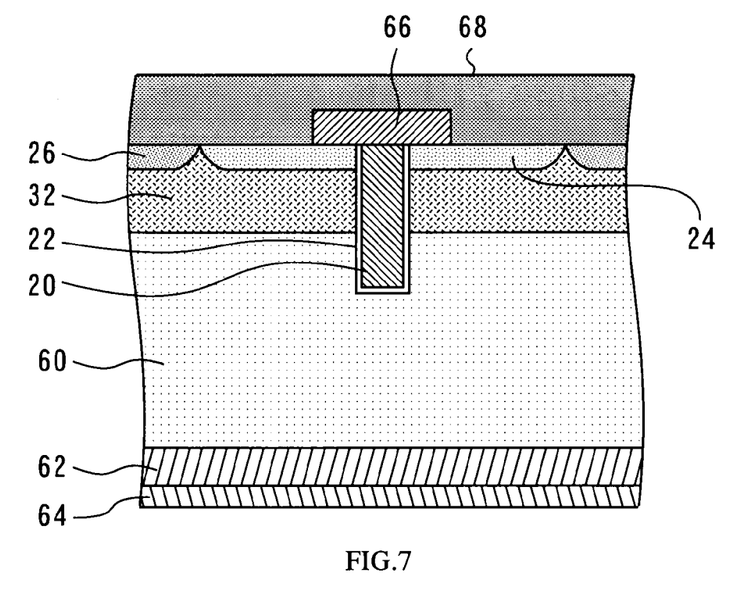
FIG. 7 illustrates the break in the dummy trench.

FIG. 7 illustrates the break in the dummy trench 23. The dummy trench 23 is a trench gate that is thinned out, and does not receive the supply of a gate drive signal. The dummy trench 23 is formed solely to suppress a saturation current and provide an enhanced short-circuit capability. More specifically, the dummy trench 23 can be intrinsically used as a trench gate, but is not connected to a gate electrode because it reduces the total channel length of a MOS section to obtain a proper saturation current value. FIG. 7 is a cross-sectional view taken along line 7-7 in FIG. 6. For the sake of explanation, FIG. 7 shows an insulation film 66 and a source electrode 68, which are not shown in FIG. 6. In FIG. 6, a portion in which the source electrode 68 is in contact, for instance, with the P+ region 26 or source region 24 is enclosed as a contact 28.

FIG. 7 indicates that, within a break in the dummy trench 23, the base region 32, which is positioned directly below the source region 24, is electrically connected to the P+ region 26, which is a high-concentration impurity region, to provide a hole emission path.

Figure 8:
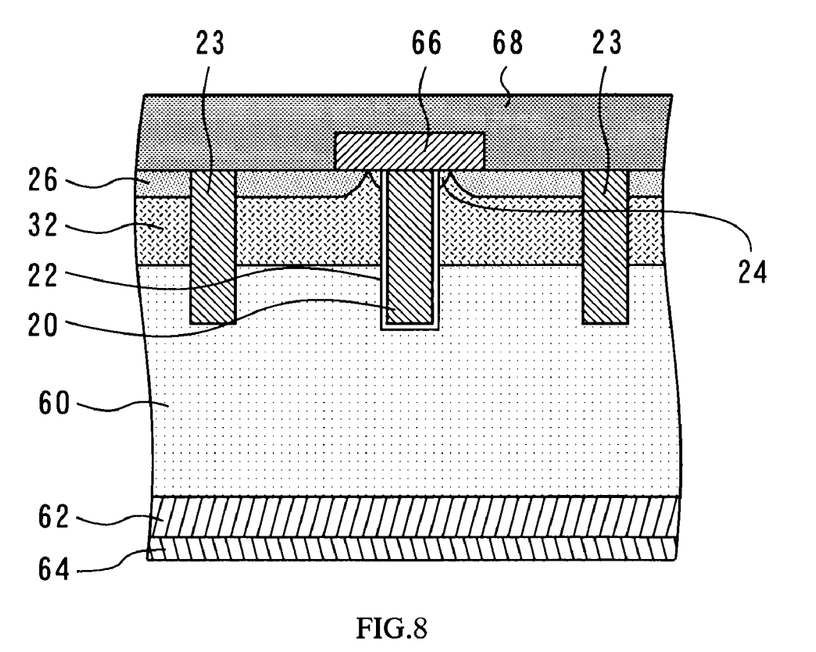
FIG. 8 is a cross-sectional view that is taken along line 8-8 in FIG. 6 to illustrate the dummy trench.
Figure 9:
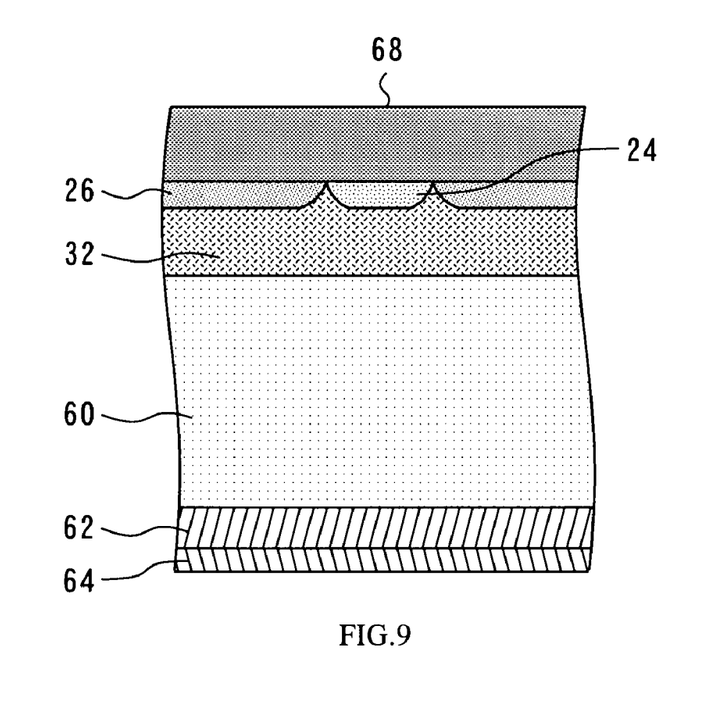
FIG. 9 is a cross-sectional view taken along line 9-9 in FIG. 6.

FIG. 8 is a cross-sectional view that is taken along line 8-8 in FIG. 6 to illustrate the dummy trench 23. FIG. 9 is a cross-sectional view taken along line 9-9 in FIG. 6. As is obvious from FIG. 8, a part of the base region 32 is sandwiched between the dummy trench 23 and the trench gate 20. In the direction of depth, the dummy trench 23 is formed to reach the semiconductor substrate 60, as is the case with the trench gate 20.

As described in connection with the first embodiment, the holes in the base region 32 directly below the source region 24 need to be emitted rapidly at the time, for instance, of element turn-off to provide latch-up suppression. In the present embodiment, a break is provided in the dummy trench 23 to newly form an emission destination for the holes in the base region 32 directly below the source region 24.

If, for instance, there is no break in the dummy trench, holes directly below a long portion of the source region 24, which is shown in FIG. 6, are moved to the P+ region 26, which is formed in parallel with the longitudinal direction of the trench gate 20, and emitted out of the base region 32. More specifically, the holes are emitted in the directions indicated by arrows A and B in FIG. 6. However, the present embodiment is configured so that there is a break in the dummy trench 23; therefore, the holes in the base region 32 directly below the source region 24 can be emitted in the direction indicated by arrow C in FIG. 6. Consequently, the resistance of the base region 32 can be decreased to suppress the latch-up of the semiconductor device.

As described above, the present embodiment is characterized in that the dummy trench 23 with a break is positioned toward the trench gate 20 rather than toward a part of the P+ region 26. Therefore, the holes directly below the source region 24 can be emitted through the break in the dummy trench 23 to the P+ region 26, which is positioned in a direction opposite the direction from the dummy trench 23 to the trench gate 20. In this manner, the present embodiment can decrease the resistance of the base region 32 although such a resistance decrease cannot be accomplished when a continuous dummy trench is formed. Some modifications of the present invention will be described below with reference to FIGS. 10 to 12 and FIGS. 14 to 16.

Figure 10:
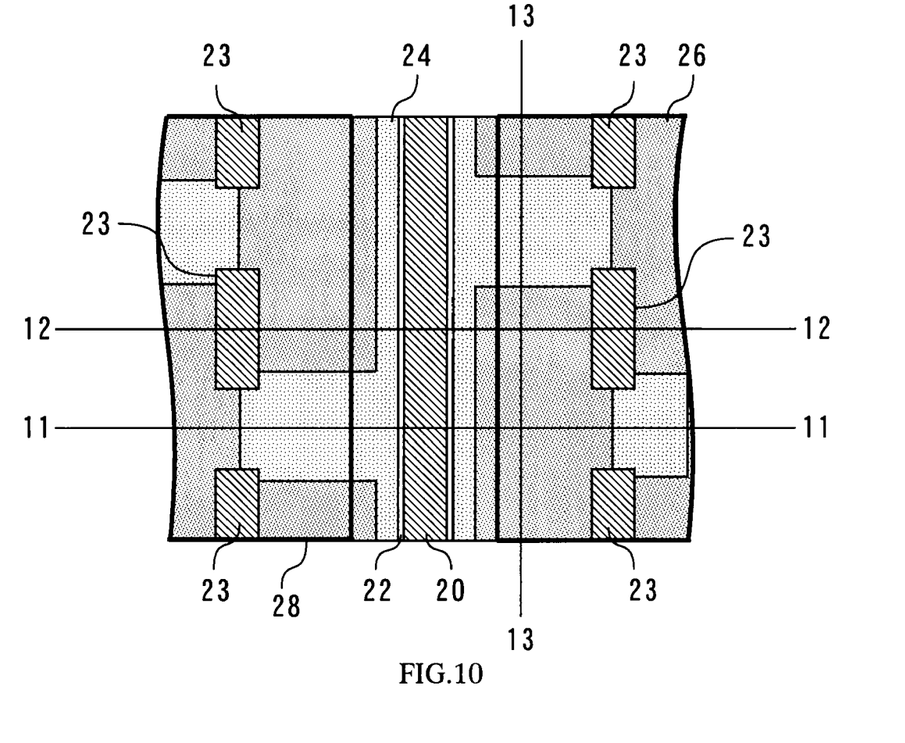
FIG. 10 shows a dummy trench which has breaks.
Figure 11:
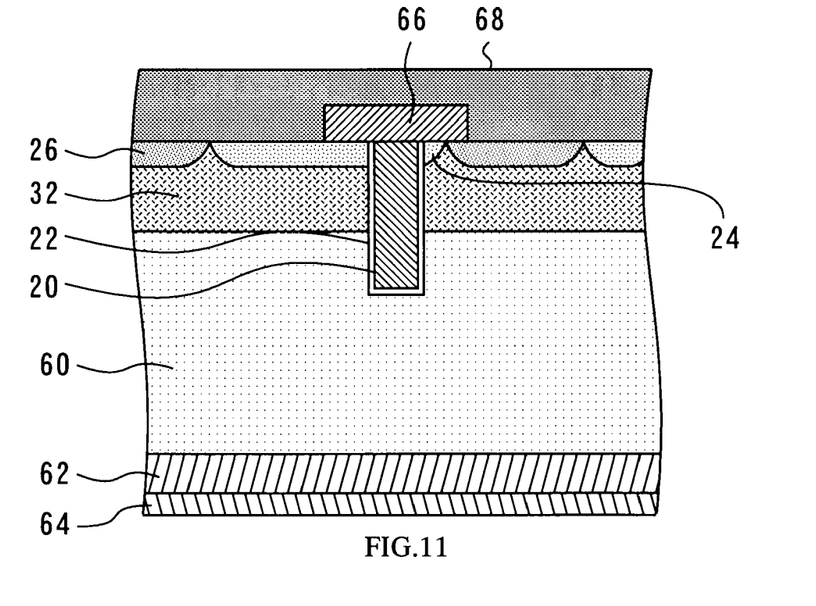
FIG. 11 is a cross-sectional view taken along line 11-11 in FIG. 10.
Figure 12:
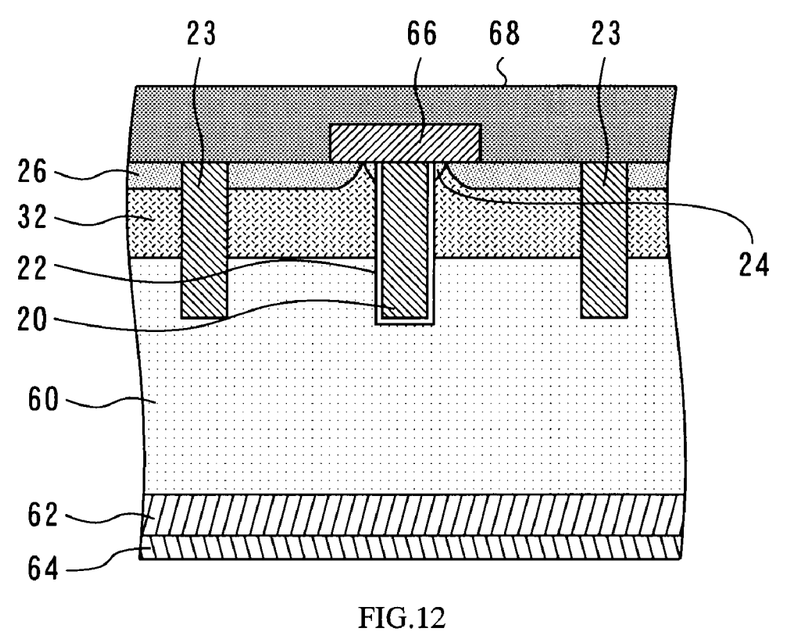
FIG. 12 is a cross-sectional view taken along line 12-12 in FIG. 10.
Figure 13:
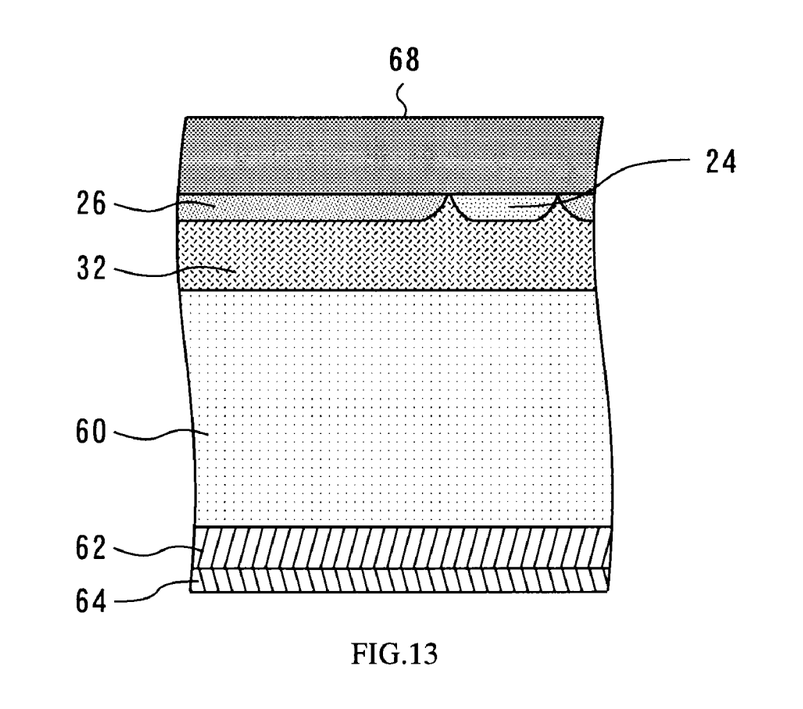
FIG. 13 is a cross-sectional view taken along line 13-13 in FIG. 10.

FIGS. 10 to 12 are diagrams illustrating the configuration of a semiconductor device to which the present invention is applied in a situation where the trench gate and dummy trench are disposed in a ratio of 1 to 1. FIG. 10 is a plan view of this modification. A dummy trench 23, which has breaks and is formed linearly and discontinuously, supplies different breaks to a source region 24 extended from a trench gate 20 and to a source region 24 extended from another trench gate (not shown). Therefore, the dummy trench 23 can provide a hole emission path for each of different source regions 24 that are positioned on the right and left sides as viewed from the dummy trench 23. FIG. 11 is a cross-sectional view taken along line 11-11 in FIG. 10. FIG. 12 is a cross-sectional view taken along line 12-12 in FIG. 10. FIG. 13 is a cross-sectional view taken along line 13-13 in FIG. 10.

Figure 14:
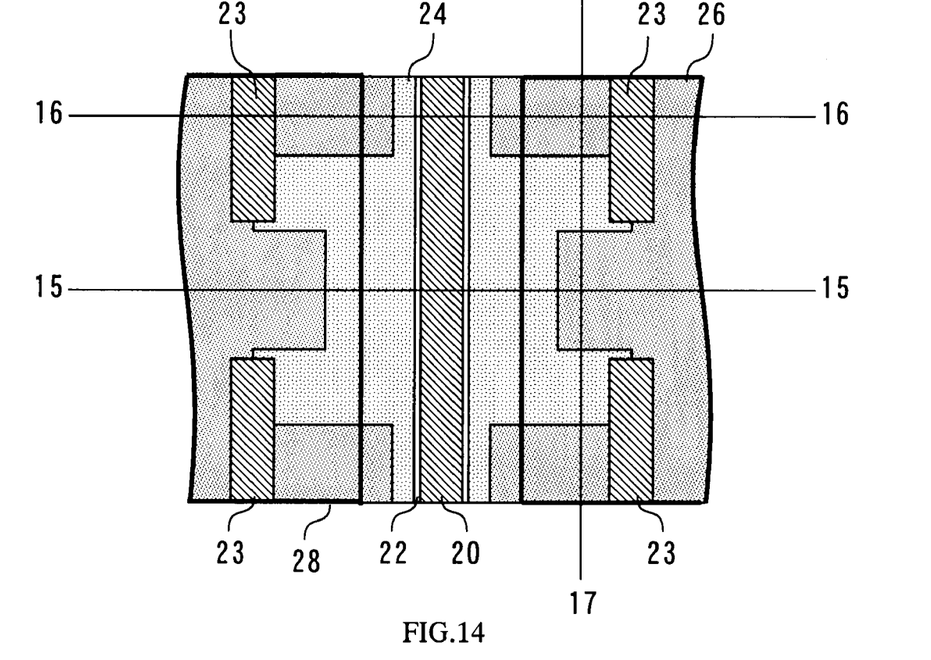
FIG. 14 shows a semiconductor device that uses a concave source region.
Figure 15:
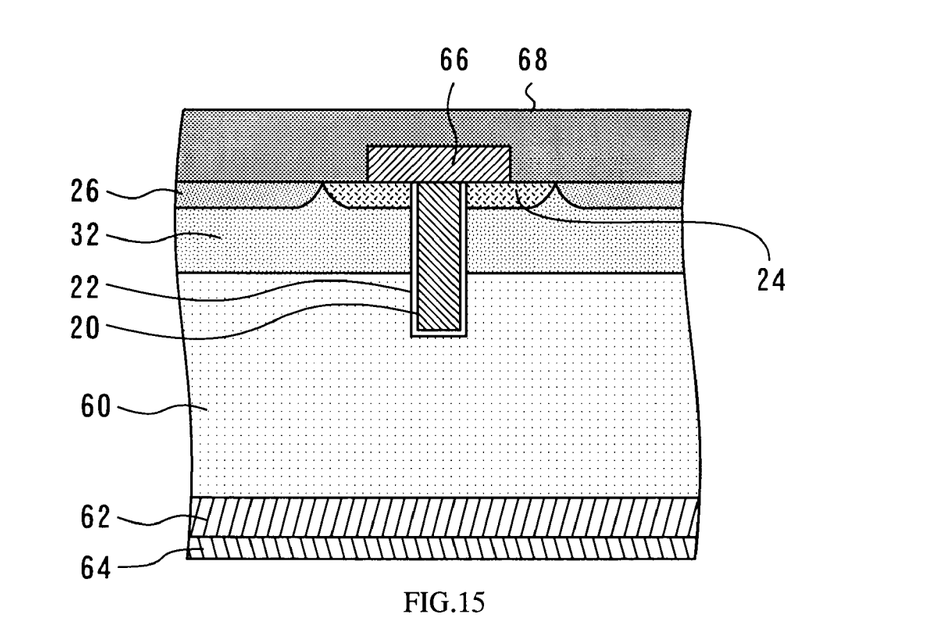
FIG. 15 is a cross-sectional view taken along line 15-15 in FIG. 14.
Figure 16:
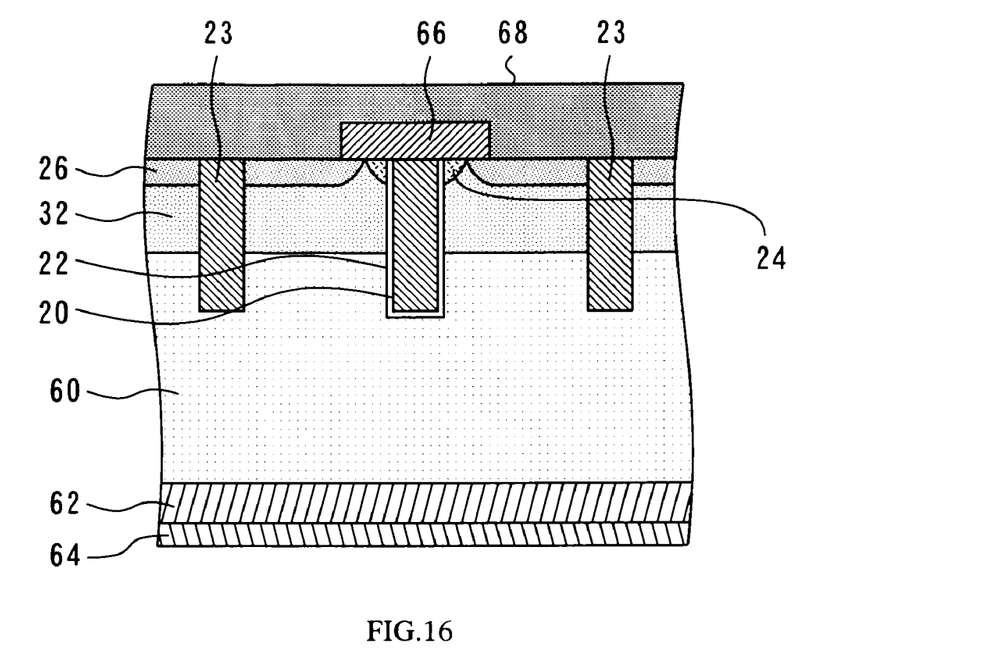
FIG. 16 is a cross-sectional view taken along line 16-16 in FIG. 14.
Figure 17:
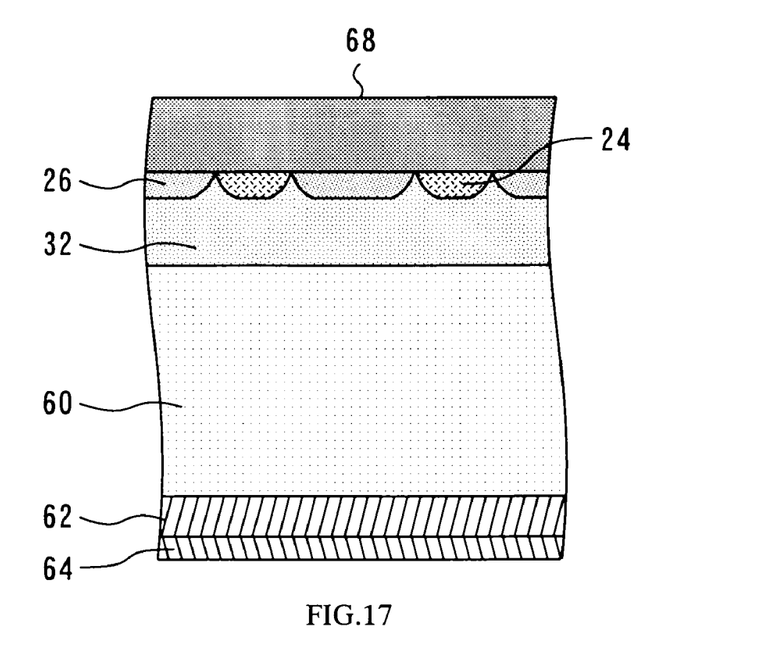
FIG. 17 is a cross-sectional view taken along line 17-17 in FIG. 14.

FIGS. 14 to 16 are diagrams illustrating a semiconductor device that uses a concave source region 24 to decrease the resistance of the base region. FIG. 14 is a plan view of this modification. The dummy trench has a break as described earlier. This modification is further characterized in that the source region 24 is concaved as indicated by its plan view. An elongated portion of the source region 24 may be formed over a relatively large range in order to make the saturation current of the semiconductor device appropriate. In such an instance, particularly the holes in the base region 32 directly below the center of the elongated portion of the source region 24 cannot be emitted with ease. However, when an adequate concaved source region 24 is used in accordance with the present embodiment, even the holes in the base region 32 directly below the center of the elongated portion of the source region 24 are easily emitted to the P+ region 26. This enhances the effect of decreasing the resistance of the base region 32. FIG. 15 is a cross-sectional view taken along line 15-15 in FIG. 14. FIG. 16 is a cross-sectional view taken along line 16-16 in FIG. 14. FIG. 17 is a cross-sectional view taken along line 17-17 in FIG. 14.

As described above, the present invention decreases the resistance of the base layer by providing the dummy trench with a break and decreases the resistance of the source region 24, for instance, by making it concave in shape. It should be noted that the present invention does not significantly affect the characteristics of the semiconductor device. Further, various modifications can be made without departure from the scope of the present invention. For example, the embodiments described above assume that the long portion of the source region 24 is extended to reach a break in the dummy trench. However, the present invention is not limited to the use of such a configuration. More specifically, the shape of the source region 24 is not particularly limited as far as the holes in the base region 32 directly below the source region 24 can be emitted to the P+ region 26 through a break in the dummy trench 23.

The present invention makes it possible to provide latch-up suppression while reducing the influence upon the characteristics of a semiconductor device.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-021739, filed on Feb. 2, 2009 including specification, claims, drawings and summary, on which the Convention priority of the present application is based, are incorporated herein by reference in its entirety.

What is claimed is:

1. A semiconductor device comprising:
a semiconductor substrate of a first conductivity type;
a base region of a second conductivity type, which is formed on the front surface of the semiconductor substrate;
a source region of the first conductivity type, which is formed on the front surface of the base region;
a collector region of the second conductivity type, which is formed on the back surface of the semiconductor substrate;
a trench gate, which is formed in a trench via a gate insulation film, the trench being formed through the source region and the base region;
an electrically conductive layer, which is formed within a contact trench that is formed through the source region;
a source electrode, which is in contact with the electrically conductive layer and the source region; and
a latch-up suppression region of the second conductivity type, which is formed within the base region, in contact with the electrically conductive layer, and higher in impurity concentration than the base region;
wherein the distance between the gate insulation film and the latch-up suppression region is not less than the maximum width of a depletion layer that is formed in the base region by the trench gate.

2. The semiconductor device according to claim 1, wherein the contact trench is deep enough to reach the base region.

3. A semiconductor device comprising:
a semiconductor substrate of a first conductivity type;
a base region of a second conductivity type, which is formed on the front surface of the semiconductor substrate;
a source region of the first conductivity type, which is formed on the front surface of the base region;
a high-concentration impurity region of the second conductivity type, which is formed on the front surface of the base region, in contact with the source region, and higher in impurity concentration than the base region;
a collector region of the second conductivity type, which is formed on the back surface of the semiconductor substrate;
a trench gate, which is formed in a trench via a gate insulation film, the trench being formed within the base region through the source region;
a dummy trench, which is formed in parallel with the trench gate and positioned toward the trench gate rather than toward the high-concentration impurity region; and
a source electrode, which is in contact with the high-concentration impurity region and the source region;
wherein the dummy trench is provided with a break.

4. The semiconductor device according to claim 3, wherein the source region is extended to reach the break in the dummy trench.

5. The semiconductor device according to claim 3, wherein the dummy trench is deep enough to reach an interface between the base region and the semiconductor substrate.

* * * * *